United States Patent [19]
Mooney et al.

[11] Patent Number: 4,635,836
[45] Date of Patent: Jan. 13, 1987

[54] TWIST-OFF DETACHABLE BELT CLIP ASSEMBLY

[75] Inventors: Charles W. Mooney, Lake Worth; Robert E. Phipps, Pompano Beach; William J. Kuznicki, Coral Springs, all of Fla.

[73] Assignee: Motorola, Inc., Schaumburg, Ill.

[21] Appl. No.: 810,109

[22] Filed: Dec. 17, 1985

Related U.S. Application Data

[63] Continuation-in-part of Ser. No. 559,130, Dec. 7, 1983, abandoned.

[51] Int. Cl.⁴ .............................................. A45F 5/00
[52] U.S. Cl. ................................... 224/247; 224/252; 224/269
[58] Field of Search ............... 224/252, 247, 242, 269, 224/271, 163, 199; 455/351; 248/316.1, 316.3, 316.4, 316.5, 313, 314

[56] References Cited

U.S. PATENT DOCUMENTS

| | | |
|---|---|---|
| D. 243,409 | 2/1977 | Eckmann et al. . |
| D. 248,759 | 8/1978 | Eckmann et al. . |
| D. 251,561 | 4/1979 | Toth et al. . |
| D. 262,965 | 2/1982 | Iwata . |
| D. 264,080 | 4/1982 | Iwata . |
| 3,179,891 | 4/1965 | Sharma . |
| 3,212,688 | 10/1965 | Lane ................ 224/252 X |
| 3,212,743 | 10/1965 | Culver .............. 248/231 X |
| 3,244,981 | 4/1966 | Der Tatevasian . |
| 3,370,236 | 2/1968 | Walker . |
| 3,623,189 | 11/1971 | Wilczynski ............ 24/3 F |
| 3,631,994 | 1/1972 | Mackzum, Jr. . |
| 3,878,589 | 4/1975 | Schaefer . |
| 3,907,182 | 9/1975 | Bryant ................ 224/252 |
| 3,956,701 | 5/1976 | James, Jr. et al. . |
| 4,046,295 | 9/1977 | Eichler . |
| 4,083,481 | 4/1978 | Selinko . |
| 4,111,343 | 9/1978 | Selinko . |
| 4,136,805 | 1/1979 | Storms ............. 224/247 X |
| 4,299,344 | 11/1981 | Yamashita et al. . |
| 4,325,142 | 4/1982 | Nakazawa . |
| 4,485,946 | 12/1984 | Liautaud et al. ........ 224/242 |
| 4,536,925 | 8/1985 | Boothe et al. ....... 224/269 X |

OTHER PUBLICATIONS

Multitone "Pocsag Paging Receiver" Catalog Sheet, (2 pages).
Alexander Battery Sales, Inc., "Porta Clip" Catalog Sheet, (2 pages).
Skydyne ® Catalog Sheet, Design Patent Application No. 06/519,452, filed Aug. 1, 1983.

Primary Examiner—Stephen Marcus
Assistant Examiner—Robert M. Petrik
Attorney, Agent, or Firm—Daniel K. Nichols; Joseph T. Downey; Mark P. Kahler

[57] ABSTRACT

A detachable mounting clip arrangement according to the present invention includes a mounting clip supported by a support structure. The mounting clip is coupled to the support structure in a manner which allows rotation of the mounting clip between a first or normal position and a second position. A latching mechanism is coupled to the support structure so that when the mounting clip is in the first or normal position the latch is closed and the mounting clip is rotated to the second position, the latch opens. This is accomplished by a CAM pin coupled to the mounting clip which engages a CAM follower slot in a sliding latch member. When the mounting clip is rotated the sliding latch member slides with respect to a fixed latch member thereby opening the latch.

10 Claims, 7 Drawing Figures

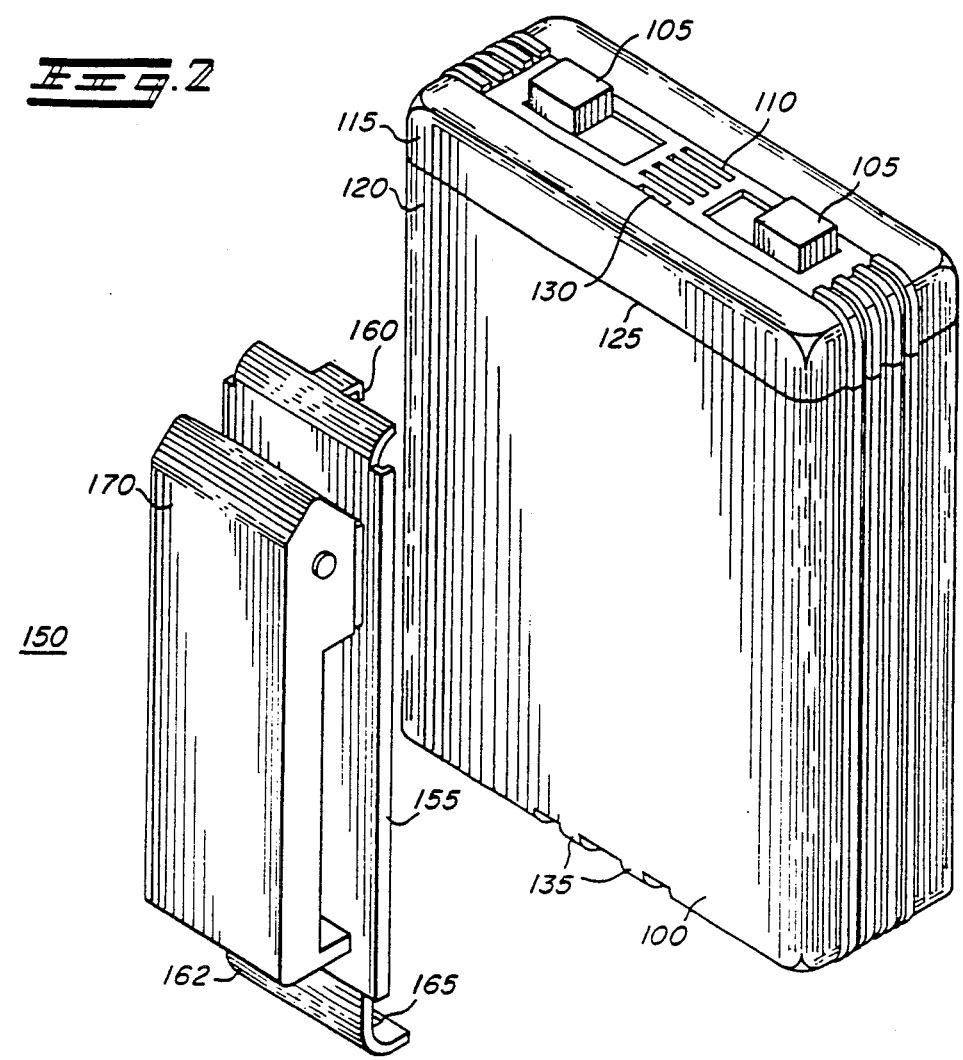
鬥.2
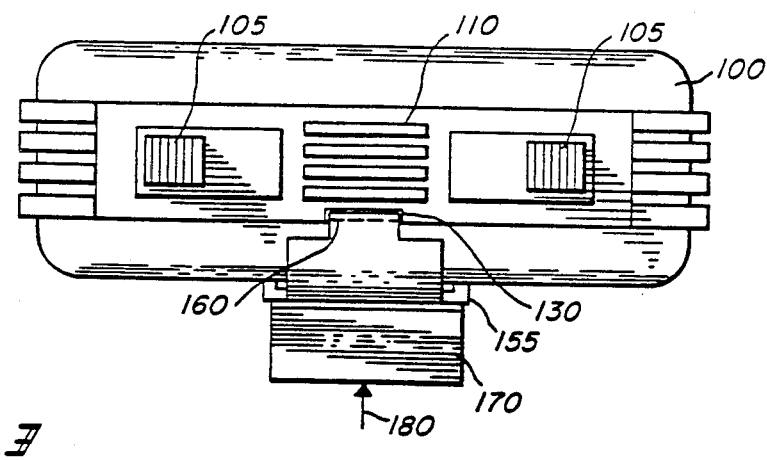
鬥.7

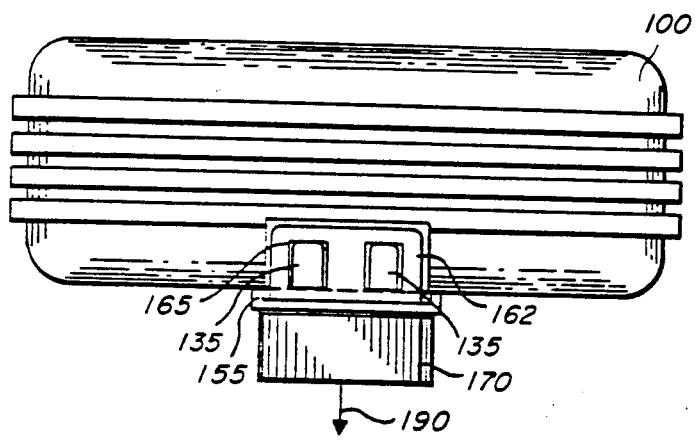
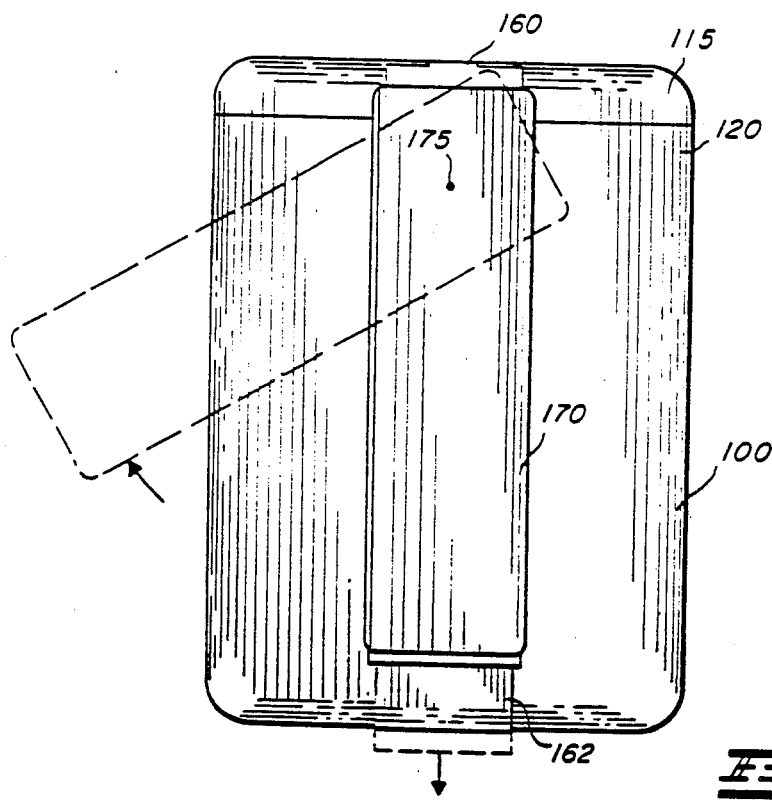

TWIST-OFF DETACHABLE BELT CLIP ASSEMBLY

CROSS REFERENCE TO RELATED APPLICATIONS

This is a Continuation-in-part application of copending application Ser. No. 559,130 filed Dec. 7, 1983, now abandoned, the disclosure of which is incorporated herein by reference.

In an application, entitled "Detachable Mounting Clip", to Andrez Guzik, et al., Serial No. 559,131 filed Dec. 7, 1983 and its continuation application Ser. No. 763,899 filed Aug. 9, 1985 and assigned to the assignee of the present invention, a removable mounting clip utilizing a pry-off arrangement is disclosed and claimed. The contents of said copending patent applications are hereby incorporated by reference.

BACKGROUND OF THE INVENTION

1. Field of the Invention

This invention relates generally to the field of mounting clip assemblies for miniature electronic devices such as paging receivers. More particularly, this invention relates to the field of easily detachable or removable mounting clip assemblies which are readily interchangable or omitted entirely from a paging receiver without causing user discomfort or sacrifice of asthetic appeal. Furthermore, the easy detachability results in improved repairability at reduced cost.

2. Background of the Invention

Mounting clips of various configurations have been used for a number of years in portable electronic devices such as paging receivers. One of the more conventional types is a spring loaded belt clip as shown in FIG. 1 which serves as an attaching mechanism allowing the user to rapidly and securily attach the pager or other electronic device to the user's belt, pocket or purse to make the device conviently accessible yet securely mounted.

An exemplary prior art belt clip style mounting clip is used in the Motorola Page Boy II ™ pager which is shown in FIG. 1 in an exploded view. This pager includes a plastic housing frame 10, which serves as the primary housing for the internal electronic circuitry. A substantially U-shaped housing cover 15 is made of metal and slides into slots 20 in the housing frame 10. An opening 25 at the top of the housing cover 15 allows access to controls which are mounted on housing frame 10. Metal housing cover 15 is also utilized as the paging receiver's antenna in the Motorola Page Boy II ™.

On the rear surface of housing cover 15, a pair of tabs 30 are punched from holes 35 and bent outwardly at a right angle to the rear surface of housing cover 15. Each of these tabs 30 is parallel to the other and additionally has a circular hole 40 punched through them.

A lanyard bracket 45 which is also somewhat U-shaped has a circular hole 50 on each side which is made to allign with circular holes 40 when lanyard bracket 45 is inserted through holes 35 from the inside of housing cover 15. On one end of lanyard bracket 45 is a lanyard mount 55 including a hole for attaching a lanyard when it is desirable to suspend the pager from a lanyard.

A belt clip style mounting clip 60, including a passage 65 running through it, is attached to the housing member 15 by means of a roll pin 70. A torsion type coil spring 75 is utilized to keep belt clip 60 in position so that the lower portion of clip 60 presses against housing member 15 thereby entrapping the user's belt, purse, etc.

When assembled, the roll pin passes through circular hole 40 to circular hole 50 into one side of passage 65, through the coil spring 75 and out the other end of passage 65 to the other circular hole 50 and the other circular hole 40. Primary support for the belt clip 60 and lanyard bracket 45 is provided by tabs 30 and roll pin 70. In order to open the belt clip, the user has simply to pull on the bottom of the belt clip away from housing cover 15, or push on the top of belt clip 60 toward the housing cover 15. The spring action of coil spring 75 normally urges the clip closed when pressure is released.

Although the assembly of FIG. 1 functions well in normal use, as technology allows for more miniaturization of paging receivers or similar electronic devices, the user may prefer to simply carry the paging receiver in his pocket without being burdened by the excess bulk of a mounting clip. When a clip is desired, the user of the prior art belt clip assembly has only one opportunity to choose what belt clip assembly he prefers and that choice must be made at the time of purchase. Replacement of belt clip 60 with a different style is difficult requiring the service of a technician. If no clip at all is desired, the user is left with mounting tab 30 protruding from the cover of housing member 15 creating an annoying discontinuity in the pager's contour which could cause user discomfort, or damage to the user's clothing and is generally not asthetically pleasing.

A detachable mounting clip arrangement for a portable paging receiver or the like is disclosed in U.S. Pat. No. 4,083,481 to George Selinko and assigned to Motorola Inc. (the assignee of the present invention). In this invention, the clip arrangement includes a tapered base plate assembly designed to insert within a recess in the housing formed by two undercut sidewalls. The base plate is retained within these recesses by a ratchet-like serated section included on the housing surface which interacts with a resilient finger extending laterally from the base plate. The base plate itself supports a conventional pivotal mounting clip assembly similar to that shown in FIG. 1 of the present application.

While this mounting clip arrangement meets the needs and objectives set forth in U.S. Pat. No. 4,083,481 the needs of the present invention (which include many of the objectives of Selinko's clip) extend beyond those objectives. The present mounting clip interacts with the housing in a manner which does not detract from the visual appearance of the pager if the belt clip assembly is removed. It is also removeable without use of any type of tool. Furthermore, the belt clip assembly of the present invention adds a substantial amount of rigidity to the pager housing with improved ease of assembly and disassembly.

SUMMARY OF THE INVENTION

It is an object of the present invention to provide an improved detachable belt clip assembly.

It is another object of the present invention to provide a removable belt clip assembly which does not detract from the visual appearance of a radio housing when the clip assembly is removed.

It is another object of the present invention to provide a belt clip assembly for a miniature receiver housing which adds to the rigidity of the receiver housing.

It is a further object of the present invention to provide an improved belt clip assembly which is readily interchangeable with other belt clip assemblies and easily replaced in the event of damage without the need for special tools or service personel.

These and other objects of the invention will become apparent to those skilled in the art upon consideration of the following description of the invention.

In one embodiment of the present invention, a detachable mounting clip arrangement especially adapted for use in conjunction with the housing of a hand-held apparatus to be worn on the person includes a mounting clip attached to a support structure which allows the mounting clip to be moved between a first and a second position. A latching mechanism is attached to the support structure such that a latched configuration is assured when the mounting clip is in the first position and an unlatched configuration is assumed when the mounting clip is in the second position.

The mounting clip is selectively rotatable about a pivoting axis for opening and closing the clip, and is selectively rotatable about an axis of rotation normal to the pivoting axis to selectively detach or latch the clip assembly to the housing.

The features of the invention believed to be novel are set forth with particularity in the appended claims. The invention itself however, both as to organization and method of operation, together with further objects and advantages thereof, may be best understood by reference to the following description taken in conjunction with the accompanying drawings.

BRIEF DESCRIPTION OF THE DRAWINGS

FIG. 2 is a view of a mounting clip assembly of the present invention along with a pager housing suited for use therewith.

FIG. 3 is a top view of the mounting clip assembly of the present invention connected to a suitable pager housing.

FIG. 4 is a bottom view of the mounting clip assembly of the present invention connected to a suitable pager housing.

FIG. 5 is a view of the pager/belt clip assembly showing the relative motion of the mounting clip and the latching mechanism.

DETAILED DESCRIPTION OF THE PREFERRED EMBODIMENT

Figure 1:
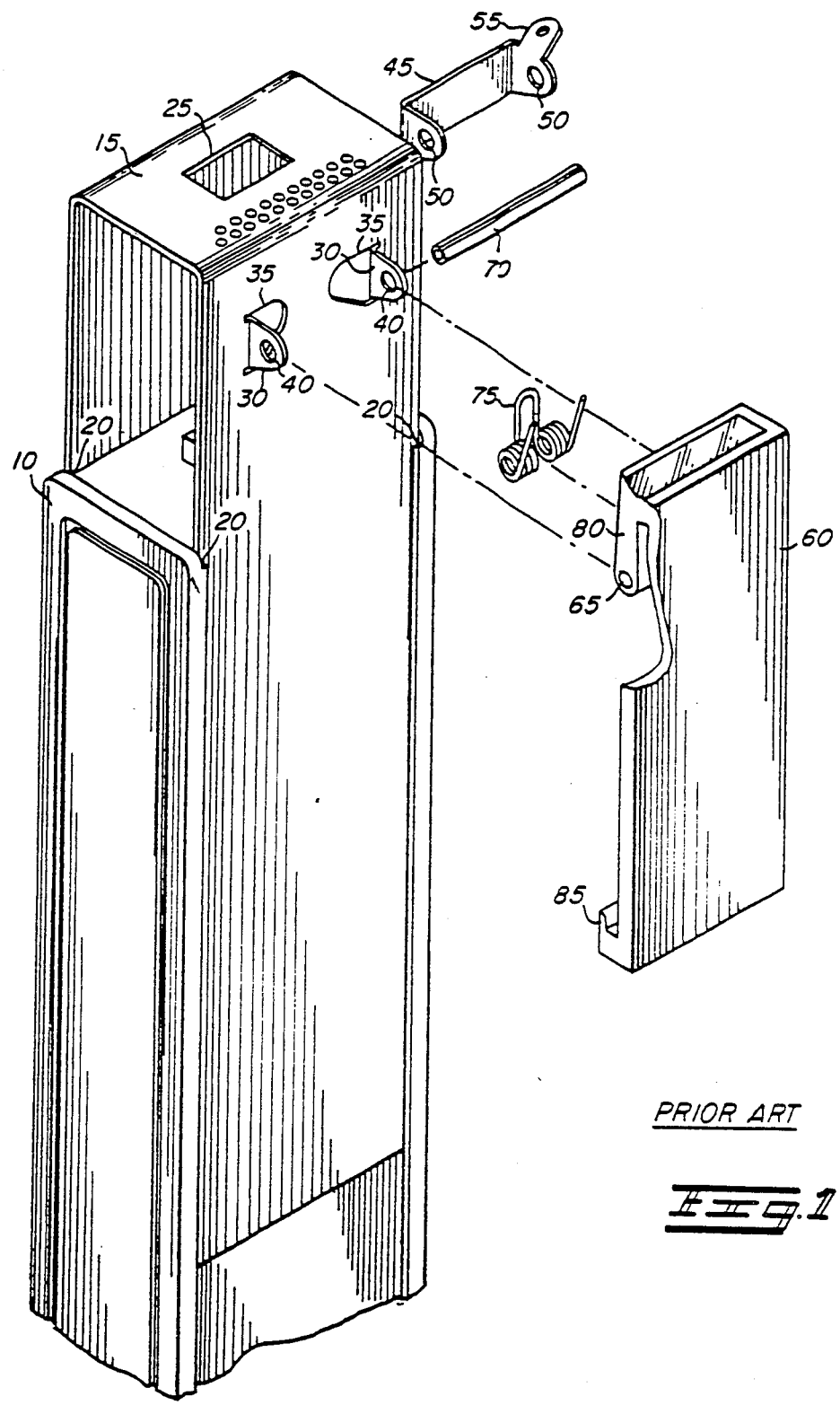
FIG. 1 is an exploded view of a belt clip arrangement of the prior art including a cutaway portion of the belt clip.

Turning now to FIG. 2 view of the belt clip arrangement of the present invention is shown. In the preferred embodiment the invention is practiced in conjunction with a portable electronic device such as a pager housing 100. In this embodiment the pager includes several controls, switches, or indicators 105 situated on its top surface, also situated on the top surface is grill-work 110 which is utilized to port the pager's annunciator to the outside of the pager housing so that the the user is clearly able to hear when he is being paged. Housing 100 may be made of plastic and may include an upper housing portion 115 and a lower housing portion 120 which are normally joined together but separate upon disassembly of the receiver housing for service. A joining line 125 results and it is preferrably disguised by the pager's ornamental design.

In the preferred embodiment, an additional slot 130 is provided adjacent the grill-work 110 in a manner such that slot 130 appears to be (or actually is) a portion of that grill-work. A pair of wedgeshaped protuberancies or bosses 135 are situated at the lower portion of housing section 120. More or less than two such bosses may be preferrable in some embodiments.

The belt clip style mounting clip arrangement of the present invention is shown generally as 150 and includes a base structure 155 having a hook 160 at one end. Hook 160 is of an appropriate dimension to mate in slot 130 so that hook 160 and slot 130 form a mechanical coupling mechanism. At the lower end of base structure 155 there is a sliding member 162 having a pair of apertures 165. A mounting clip 170 is mounted to the base structure to be used in attaching the radio to the person.

Turning now to FIG. 3, a view of the top portion of housing 100 with mounting clip assembly 150 attached thereto is shown. In this figure the hook 160 is shown to be engaged in slot 130. In FIG. 4, the lower portion of housing 100 is shown to illustrate the manner in which bosses 135 are captured within apertures 155. FIGS. 3 and 4 will be referred to later.

The latching mechanism of the present invention which serves to attach mounting clip assembly 150 to housing 100 utilizes sliding member 162. By causing sliding member 162 to move downward linearly, hook 160 and apertures 165 are moved apart far enough to allow housing 100 to be either attached to or detached from assembly 150. When attaching, assembly 150 is appropriately positioned adjacent housing 100, and sliding member 162 is retracted so that hook 160 is firmly received within slot 130 and bosses 135 are firmly received within apertures 165. Preferably, this is accomplished by a cam action which translates the rotational movement of clip 170 as shown in FIG. 5 to a linear movement of sliding member 162.

In FIG. 5 the latched positioned of assembly 150 is shown in solid lines. The broken lines indicate one of the positions of mounting clip 170 required to unlatch the latching mechanism. The rotation of mounting clip 170 may preferrably be in either direction about an axis of rotation perpendicular to the drawing and shown in FIG. 5 as 175.

It is also desirable for the mounting clip 170 to be locked in the position shown in solid lines in FIG. 5 so as to prevent inadvertant unlatching of the latching mechanism. In one embodiment of the present invention, this locking mechanism is deactuated to allow rotation by exerting pressure on mounting clip 170 in the direction of arrow 180 in FIG. 3. According to another embodiment of the present invention, the locking mechanism may be deactuated by lifting the bottom of mounting clip 170 to a position beyond the normally open position of the mounting clip. This is equivalent to exerting force in the direction of arrow 190 of FIG. 4.

Figure 6:
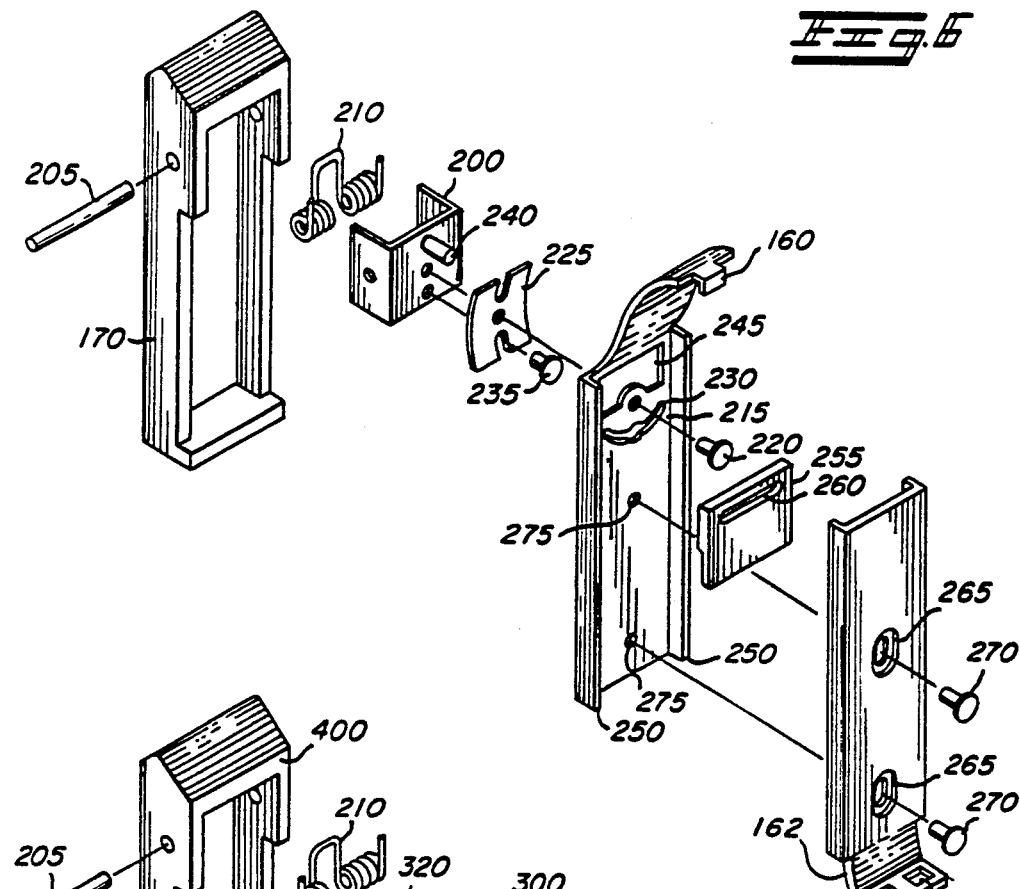
FIG. 6 shows an exploded view of a preferred embodiment of the present invention having a push to unlock feature.

Turning now to FIG. 6, a more detailed exploded view of a preferred embodiment of the present invention is shown. According to this embodiment, the locking mechanism is deactuated by exerting force on the mounting clip as shown in FIG. 3. That is, force is exerted in a direction which tends to urge the mounting clip towards the support assembly and the housing 100 to a retracted position. In this embodiment mounting clip 170 is pivotally coupled to a rotatable bracket 200 by a roll pin 205, or similar pivot mechanism defining an axis of rotation of the clip. The roll oin 205 is inserted into holes through the side of mounting clip 170 and bracket 200. Roll pin 205 is also inserted through a torsion spring 210 in order to provide a spring action on the mounting clip which normally urges the clip to the closed position. Mounting clip 170 may be made of plastic, stainless steel, or aluminum in the preferred embodiment, but this is not to be limiting. Bracket 200 is preferrably made of stainless steel or aluminum.

Bracket 200 is connected to a fixed latch member 215 by a first shoulder rivet 220. A leaf spring 225 is sandwiched between bracket 200 and fixed latched member 215. Fixed latch member 215 is provided with an arcuate or semicircular slot 230 having an enlarged opening in the center. A second shoulder rivet 235 is also connected to bracket 200 through leaf spring 225. The head of shoulder rivet 235 rests within the aperture at the center of semicircular slot 230. The width of semicircular slot 230 is appropriately dimensioned to accept the shoulder portion of shoulder rivet 235 when leaf spring 225 is compressed but too narrow to accept the head of shoulder rivet 235. A cam pin 240 is attached to bracket 200 and when assembled fits through an opening 245 in fixed latch member 215. Fixed latch member 215 preferrably includes a pair of side walls 250 so as to form a channel of sorts for accepting sliding latch member 162. Although shoulder rivets are shown, one skilled in the art will recognize that they may be replaced by rivets and spacers or other similar fastening devices.

A sloted cam follower member 255 forms a part of or is attached to sliding latch member 162. The slotted cam follower member 255 includes a slot 260 which engages cam pin 240 at all times. This sloted cam follower member may be either spot welded, soldered, glued or molded as a part of sliding latch member 162. Sliding latch member 162 includes a pair of elongated holes 265 surrounded by depressed areas. Shoulder rivets 270 are used to couple the sliding latch member to the fixed latch member. The ends of the rivets are attached to a pair of holes 275 in the fixed latched member 215. The depressed areas of elongated holes 265 are preferrably dimensioned so that the head of rivets 270 are substantially flush with the surface of sliding latch member 162. The width of sliding member 162 is appropriately dimentioned to fit within the walls 250 of fixed latch member 215. The elongation of holes 265 permits the limited sliding of sliding latch member 162 relative to fixed latch member 215. In the preferred embodiment, fixed latch member 215 and sliding latch member 162 and slotted cam follower member 255 are all made of stainless steel but this is not to be limiting.

When fully assembled operation of this embodiment is as follows. The mounting clip is pressed inwardly near the area of roll pin 205 toward fixed latch member 215. This compresses leaf spring 225 and pushes the head of shoulder rivet 235 out of the central aperture of semicircular slot 230 thereby unlocking the locking mechanism. The stepped walls of slotted cam follower member 255 prevents friction and the interference from the head of shoulder rivet 220.

Since the head of shoulder rivet 235 is now extended beyond the surface of fixed latch member 215 the mounting clip may be rotated about shoulder rivet 220 (which serves as an axis of rotation) in either direction until the shoulder area of shoulder rivet 235 comes to rest at the end of semi-circular slot 230. This rotating action causes cam pin 240 which is engaged in cam follower member 255 to convert the rotational motion of mounting clip 170 to a linear sliding motion of sliding latch member 162 so that latch member 162 extends in a direction which forces apertures 165 away from bosses 135. This places the latch in an open configuration. To put the latch back in the closed configuration, mounting clip 170 is simply rotated back to the position of its normal operation; that is, substantially aligned vertically with fixed latch member 215.

Figure 7:
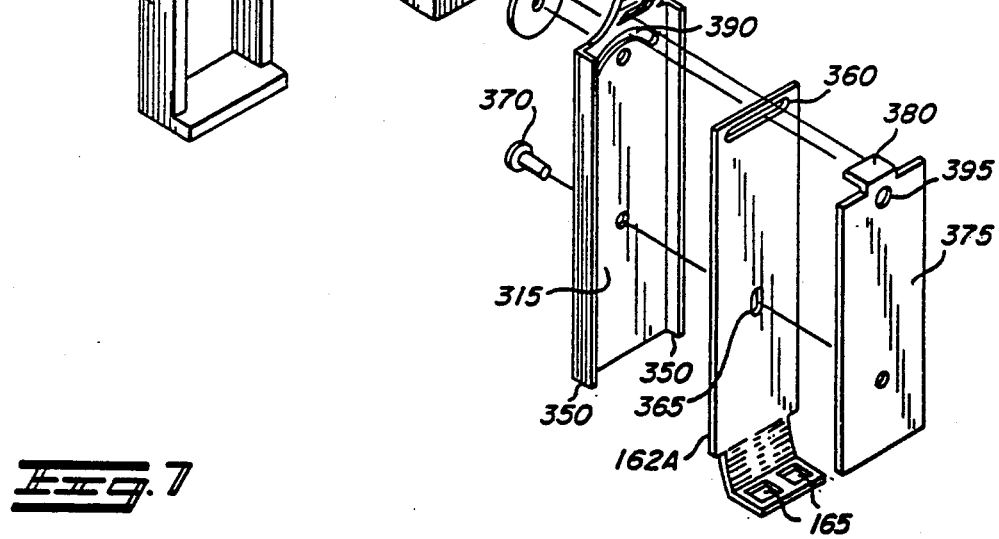
FIG. 7 is an exploded view of an alternate embodiment of the present invention having a lift open to unlock feature.

Turning now to FIG. 7, an alternate embodiment of the present invention is shown. In this embodiment, mounting clip 170 is pivotally attached to a bracket 300 by means of roll pin 205. Roll pin 205, defining the pivoting axis of clip 170, also passes through torsion spring 210 which normally urges mounting clip 170 into its closed position. A fixed latch member 315 is riveted to a bracket 300 by a rivet 320. Rivet 320 defines an axis of rotation for the present embodiment of this invention and is therefore somewhat analogous to shoulder rivet 220 of the previous embodiment. A nylon washer 325 is sandwiched between bracket 300 and fixed latch member 315 to provide a low friction bearing surface for rotation.

Fixed latch member 315 also includes a pair of raised walls 350 to provide a channel within which sliding latch member 162A operates. Sliding latch member 162A includes an elongated hole 365 through which a rivet 370 is passed in order to fasten sliding latch member 162A to fixed latch member 315. A cam follower slot 360 is provided at the upper end of sliding latch member 162A and serves a function similar to cam slot 260 of the previous embodiment. In this embodiment, however, cam slot 360 is shown as an integral part of sliding latch member 162A.

A cantilever spring member 375 is also attached to fixed latch member 315 by rivet 370. This cantilever spring member 375 is preferrably made of spring tempered stainless steel. A right angle projection 380 serves as a lock release button in the final assembly. When rivet attaches fixed latch member 315 and sliding latch member 162A along with cantilever spring member 375, this right angle projection 380 passes over the top of sliding latch member 162A and through an aperture 385 in fixed latch member 315. This right angle projection also passes over the top of bracket 300 and projects beyond it. When rivet 320 is also installed, a cam follower 340 attached to bracket 300 passes through an arcuate slot 390 to Cam follower slot 360 and finally into an aperture 395 in cantilever spring member 375.

In this embodiment cam pin 340 itself serves as a portion of the locking mechanism by normally engaging the aperture 395 in cantilever spring 375. To unlock the locking mechanism, mounting clip 170 is pivoted open beyond the point where it would normally be considered open. This forces the right angle projection 380 against a surface 400 of mounting clip 170. When sufficient force is exerted, cantilever spring member 375 flexes sufficiently to allow cam pin 340 to no longer project through aperture 395. At this point rotation about rivet 320 is possible with cam pin 340 in arcuate slot 390.

Rotation about rivet 320 produces a cam action wherein cam pin 340, operating within cam slot 360, translates the rotation of mounting clip 170 into the vertical sliding action of sliding latch member 162A thereby unlatching the locking mechanism. To latch the mechanism, the mounting clip 170 is simply rotated back to its normal position causing cantilever spring member 375 to once again captivate cam pin 340.

In the embodiment of FIG. 7, mounting clip 170 is preferrably made of a relatively hard material so that right angle projection 380 will not induce undue wear on surface 400. Alternately, surface 400 may be made of a relatively hard material while the remainder of mounting clip 170 is made of a relatively soft material such as plastic. Fixed latch member 315 along with sliding latch member 162A is preferrably made of stainless steel or aluminum as is bracket 300.

While both of the present embodiments show use of hook 160 and apertures 165 as a mechanism for engaging a housing it would be clear to those skilled in the art that any number of techniques may be utilized to grasp the housing while not detracting from the asthetic appeal of the housing of the mounting clip is removed entirely. It will also be clear that various other techniques for unlocking the mounting clip from its normal position to allow rotation will occur to those skilled in the art.

Thus, it is apparent that in accordance with the present invention an apparatus that fully satisfies the objectives, aims and advantages is set forth above. While the invention has been described in conjunction with specific embodiments, it is evident that many alternatives, modifications and variations to those embodiments will become apparent to those skilled in the art in light of the foregoing description. Accordingly, it is intended that the present invention embrace all such alternatives, modifications and variations as fall within the spirit and broad scope of the appended claims.

What is claimed is:

1. A detachable mounting clip assembly for use with a portable, hand-held device having a housing with clip receiving means on the top and bottom surfaces thereof, said clip assembly comprising:

a base having first and second base members slidable with respect to one another along a longitudinal axis thereof, each of said base members including latch means which, when said base members are in a set position with respect to each other, mate with said top and bottom receiving means respectively to releasable latch said base to the housing;

a mounting clip operatively affixed to said base member; and a rotatable bracket member, operatively connected to the base, said bracket further including means engaging one of said base members for moving apart said slidable base members along said longitudinal axis when said bracket member is rotated to a predetermined position; whereby, said latching means detaches from said receiving means when said bracket is rotated to said predetermined position.

2. The detachable mounting clip of claim 1, further including locking means for releasably locking said bracket member in a first position to avoid inadvertent rotation and unlatching of said base members.

3. The detachable mounting clip assembly of claim 2, further including releasing means for selectively unlocking said locking means.

4. The detachable mounting clip assembly of claim 2, further including pivot means for attaching the mounting clip to the bracket member and permitting pivotal movement of said mounting clip between a normal closed position and a normal open position.

5. The detachable mounting clip assembly of claim 4, wherein said locking means further includes releasing means for unlocking said locking means in response to pivoting said mounting clip beyond said normal open position.

6. The detachable mounting clip assembly of claim 5, wherein said locking means further includes a projection carried by one of said base members, the other of said base members including an aperture for receiving the projection in locking engagement, said mounting clip operatively engaging said projection to release the projection from the aperture when the mounting clip is pivoted beyond said normal open position.

7. The detachable mounting clip assembly of claim 2 wherein said locking means further includes releasing means for unlocking said locking means in response to exertion of a predetermined force in a direction which urges said mounting clip toward said base.

8. The detachable mounting clip assembly of claim 7, wherein said locking means further includes a shoulder rivet having a head carried by said bracket means, and
one of said base members includes an arcuate slot having a center aperture, the rivet head being received in said center aperture for locking said bracket member and being releasable from said center aperture when the mounting clip is urged toward said base for allowing rotation of said bracket with said rivet in said arcuate slot.

9. The detachable mounting clip assembly of claim 2, wherein:

said first base member latching means includes a first engagement means, adapted for engaging a first portion of said housing;

said second base member latching means includes a second engagement means, adapted for engaging a second portion of said housing;

said first base member is slidable relative to said second base member so that said first and second engagement means are a first distance apart in a first position and a second distance apart in a second position; and wherein said first distance is shorter than said second distance.

10. The detachable mounting clip assembly for use with a portable, hand-held device having a housing with clip receiving means on the top and bottom surfaces thereof, said clip assembly comprising:

a base having first and second base members slidable with respect to one another along a longitudinal axis thereof, each of said base members including a latch means which, when said base members are in a set position with respect to each other, mate with said top and bottom receiving means respectively to releasable latch said base to the housing;

a mounting clip operatively affixed to said base member; and a rotatable bracket member, operatively connected to the base, said bracket further including camming means for moving apart said slidable base members along said longitudinal axis when said bracket member is rotated to a predetermined position, whereby, said latching means detaches from said receiving means when said bracket is rotated to said predetermined positioned;

said bracket member further including pivot means for permitting pivotal movement about a pivoting axis of said mounting clip between a normal open position and a normal closed position;

said bracket member further including rotation means for permitting rotation of said bracket member and mounting clip to said predetermined open position, and said rotation occurs about an axis of rotation substantially normal to said pivoting axis, said first base member latching means including a first engagement means, adapted for engaging a first portion of said housing;

said second base member latching means including a second engagement means, situated adjacent said second end, adapted for engaging a second portion of said housing;

said first base member being slidable relative to said second base member so that said first and second engagement means are a first distance apart in a first position and a second distance apart in a second position;

wherein said first distance is shorter than said second distance; and said bracket member further including a cam pin coupled to said mounting clip so that said cam pin rotates about said axis of rotation when said mounting clip is rotated; and wherein said second base member includes a slotted cam follower engaging said cam pins, so that rotation of said mounting clip is converted to a linear sliding motion of said second coupling member to effect change in the distance between said first and second engagement means.

* * * * *